United States Patent [19]

Yu

[11] Patent Number: 4,973,926

[45] Date of Patent: Nov. 27, 1990

[54] LOW FREQUENCY CARRIERBAND MULTI-PORT SIGNAL COUPLER

[75] Inventor: Hong Yu, Nashua, N.H.

[73] Assignee: CaSat Technology, Inc., Amherst, N.H.

[21] Appl. No.: 277,753

[22] Filed: Nov. 30, 1988

[51] Int. Cl.$^5$ .............................................. H03H 7/48
[52] U.S. Cl. ..................... 333/112; 333/119; 333/131
[58] Field of Search ............... 333/112, 119, 131, 100, 333/118, 124; 455/3, 6

[56] References Cited

U.S. PATENT DOCUMENTS

| | | | |
|---|---|---|---|
| 3,832,647 | 8/1974 | Beurrier | 333/100 X |
| 3,872,408 | 3/1975 | Reilly | 333/112 |
| 4,419,636 | 12/1983 | Yu | 333/131 |
| 4,467,293 | 8/1984 | Apel | 333/112 |

Primary Examiner—Paul Gensler
Attorney, Agent, or Firm—Wolf, Greenfield & Sacks

[57] ABSTRACT

A low frequency multi-port signal coupler employing hybrid transformer coupling circuitry for intercoupling from a main communication line to output taps. In one embodiment, the coupler has two tap ports interconnected by two core transformers, each having a termination resistor associated therewith. In another embodiment of the invention, there are four tap ports interconnected by a single core transformer having a split-matching isolation resistor associated with each output tap, and a pair of termination resistors at the input and output of the primary winding. An impedance matching inductance is provided at the input in both embodiments.

22 Claims, 9 Drawing Sheets

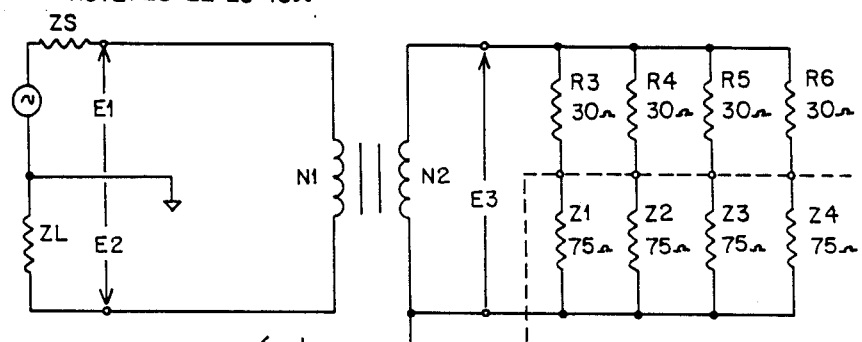
FIG.10(a)
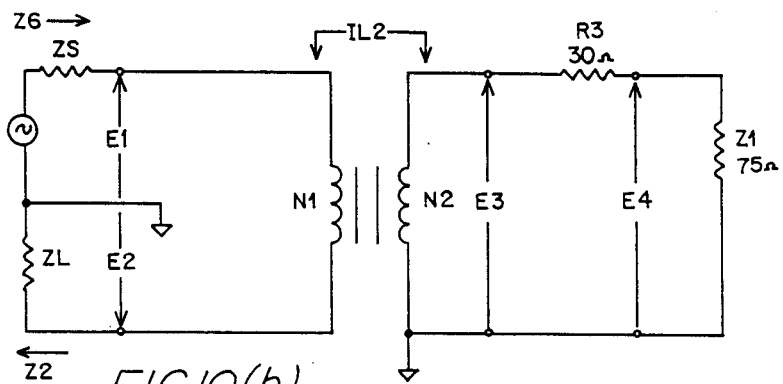
FIG.10(b)
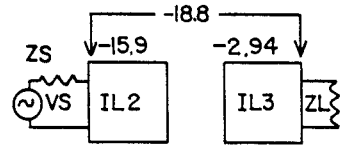
FIG.10(d)
FIG.10(c)

LOW FREQUENCY CARRIERBAND MULTI-PORT SIGNAL COUPLER

BACKGROUND OF THE INVENTION

The present invention relates in general to low frequency carrierband multi port signal couplers. More particularly, the invention pertains to multi port couplers that are characterized by improved isolation, particularly between ports of the coupler, as well as having improved impedance matching characteristics.

Reference is made to the assignee's U.S. Pat. No. 4,419,636, granted Dec. 6, 1983, on a low frequency wide band signal coupler.

Carrierband local area networks are designed to provide single channel, low cost communication networks, for use in, for example, factory automated environments. These networks are primarily intended to be used as a local sub network, typically supporting thirty to sixty nodes of communication. One problem with existing networks is that they are unduly complex in construction, requiring relatively complex and costly circuitry. Furthermore, existing networks do not provide proper impedance matching and, in particular, do not provide proper isolation between tap port of the network.

Accordingly, it is an object of the present invention to provide an improved low frequency carrierband multi port signal coupler that is characterized by a well maintained isolation loss between tap ports.

Another object of the present invention is to provide an improved multi-port coupler that has proper transmission line impedance matching so as to minimize any reflection that may occur along any point of the transmission medium.

A further object of the present invention is to provide a multi port coupler employing a hybrid transformer coupling circuitry that is effective in reducing the component count significantly while at the same time providing reliability and high performance.

Still another object of the present invention is to provide a low frequency carrierband multi-port multi-directional coupler having wide band-width signal coupling, such as from 500 kilohertz (KHz) to 30 megahertz (MHz).

Another object of the present invention is to provide an improved low-frequency carrierband multi-port signal coupler that is characterized by providing an appropriate amount of RF energy from the main transmission line to each tap port with a minimum insertion loss introduced into the main transmission line.

Still another obJect of the present invention is to provide a low frequency multi-port coupler that is provided with DC isolation between the center conductor of the trunk and the taps. This provides a substantially improved noise immunity.

SUMMARY OF THE INVENTION

To accomplish the foregoing and other objects, features and advantages of the invention, there is provided a low frequency carrierband multi-port and multi directional signal coupler that is basically comprised of two major components. One component is a communication (trunk) cable that is used as a medium to transport packets of information. The other component is a multi directional tap or series of taps which provide a means for tapping a specified amount of signal from the trunk cable to the subscriber device. The coupler of the present invention preferably employs transformer coupling circuitry that is significant in reducing the number of components required, while at the same time providing reliable and high performance operation. There are basically two embodiments of the present invention described herein. One is a two port embodiment and the other is a four port embodiment. The two port embodiment includes an input terminal, an output terminal, and two tap ports interconnected by two respective core transformers, each having a termination resistor associated therewith. With regard to the four port embodiment, this is comprised of an input terminal, an output terminal, and four tap ports interconnected by a single core transformer with each port having associated therewith a split-matching isolation resistor. In still a further version relating to the two and four port embodiments, isolation capacitors may be employed, as well as a Zener diode for surge protection.

BRIEF DESCRIPTION OF THE DRAWINGS

Numerous other objects, features and advantages of the present invention should now become apparent upon a reading of the following detailed description, taken in conjunction with the accompanying drawings, in which:

FIGS. 9(a)–9(e), 10(a)–10(d), 11(a)–11(f), 12(a)–12(d) are equivalent circuit diagrams of the four terminal embodiment of the present invention useful in derivations set forth herein.

DETAILED DESCRIPTION

There is now described herein a low frequency carrierband multi-port signal coupler that is adapted to be constructed in a bus topology and use phase coherent FSK modulation techniques to transmit information at 5 to 10 megabits per second (Mbps) base band data rate. The network of the present invention, in one embodiment, may exhibit an energy spectrum domain from two megahertz (MHz) to twenty megahertz (MHz).

The carrierband media components are comprised primarily of two major components. One is a trunk cable used as a medium to transport packets of information. The other is a multi-directional tap or series of taps which provide a means for tapping a specified amount of signal from the trunk cable to the subscriber device.

In accordance with one embodiment of the present invention, the multi-directional tap provides a wide band width signal coupling, such as from 500 kilohertz (KHz) to 30 megahertz (MHz), with the appropriate amount of RF energy from the main trunk cable to each tap port and with a minimum insertion loss introduced into the main trunk cable.

The present invention also is characterized by improved transmission line impedance matching, so as to minimize any reflection that may occur along any point of the medium. There is also provided well maintained isolation loss between tap ports. This parameter minimizes adjacent device interference on the same network and improves the reliability of the device.

Figure 1:
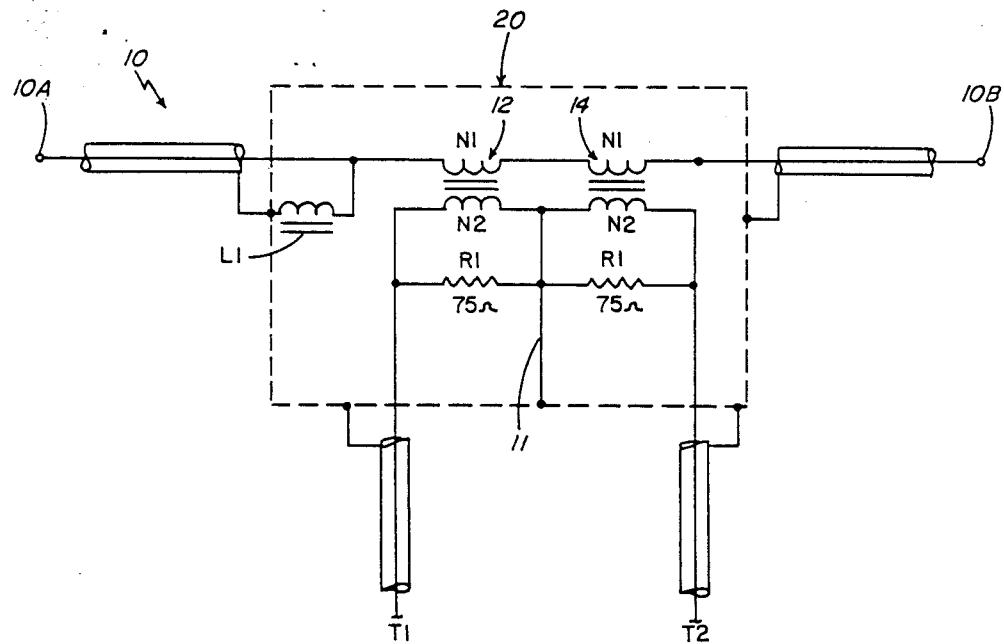
FIG. 1 illustrates a two port embodiment of the present invention.
Figure 2:
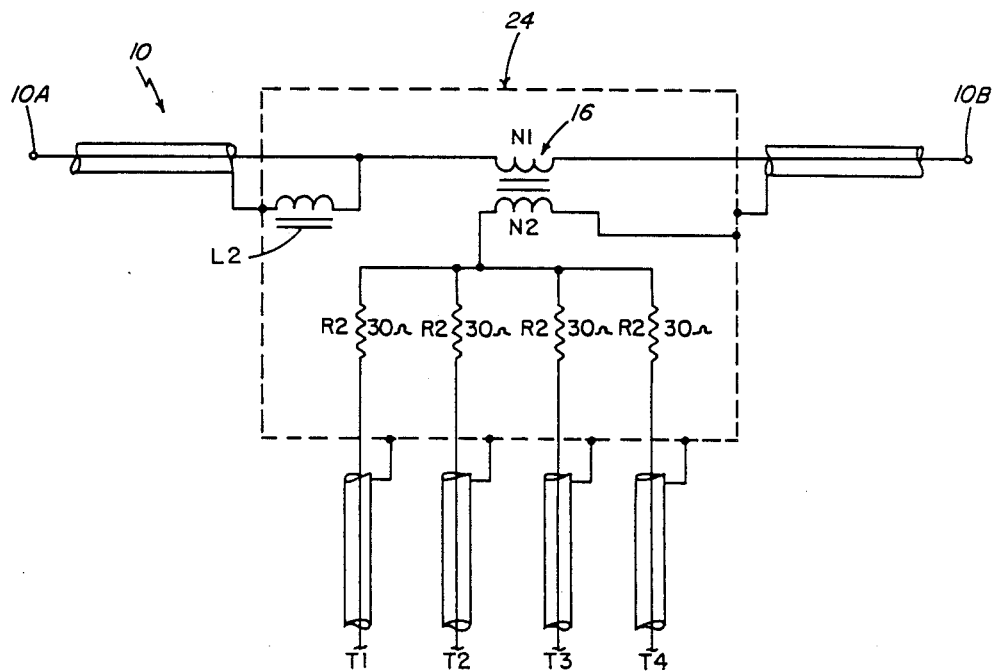
FIG. 2 illustrates a four port embodiment of the present invention.

Reference is now made to FIG. 1 for an illustration of the first embodiment of the present invention, which is a two port coupler 20. FIG. 2 illustrates a second embodiment of the invention, which is a four port coupler 24. In FIGS. 1 and 2, there is illustrated the communication cable 10 with each of the circuits having an input terminal 10A and an output terminal 10B. Both of the circuits of FIGS. 1 and 2 employ transformer coupling that provides greater reliability and improved performance.

In FIG. 1, the coupler 20 has a pair of output tap ports identified as T1 and T2. In FIG. 2, this is a four port device; thus, there are illustrated four tap ports, identified in FIG. 2 as T1, T2, T3 and T4.

In the embodiment of FIG. 1, there are provided two core transformers 12 and 14. The primary winding N1 of each transformer is coupled in the cable 10. The secondary winding of each transformer couples to the respective output tap ports T1 and T2. Associated with each of the secondary windings N2 is a termination resistor R1. The resistors R1 are shown coupled in parallel to the secondary windings. There is also a common lead 11 that ties the windings N2 and resistors R1 to shield ground.

FIG. 1 also illustrates an inductor L1 connected at the input of the coupler. This inductor is used to improve frequency dependency of the device impedance matching to the system.

The four port version of the invention, illustrated in FIG. 2, includes a single core transformer 16, having its primary winding N1 disposed in the cable 10. The secondary winding N2 of the transformer 16 connects on one side to the shield ground, and on the other side connects in common to the resistors R2. The resistors R2 are split-matching isolation resistors, and couple to each of the output port cables at T1-T4. The circuit of FIG. 2 also includes inductor L2 at the input of the coupler. Inductor L2 provides frequency dependent matching as previously discussed in conjunction with inductor L1.

Figure 3:
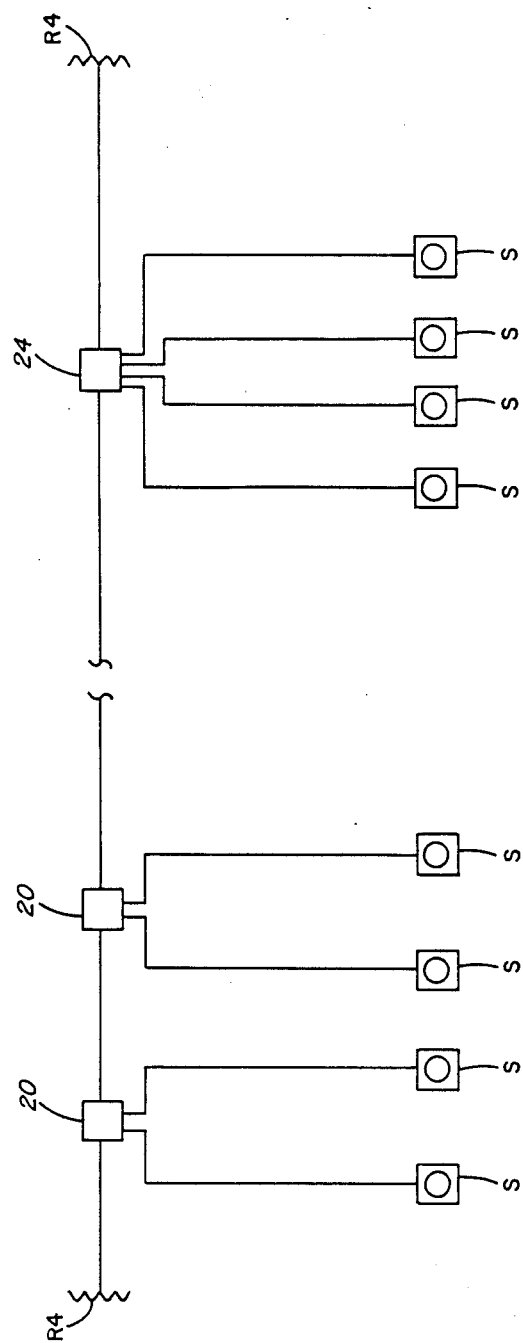
FIG. 3 is a schematic diagram illustrating a system application.

FIG. 3 shows a typical application for the couplers, as used in a multi-directional, wide band-width signal coupling arrangement. FIG. 3 shows the termination resistors R4 as well as the separate two port and four port couplers. FIG. 3 illustrates the output taps coupling to the subscriber devices S.

Figure 4:
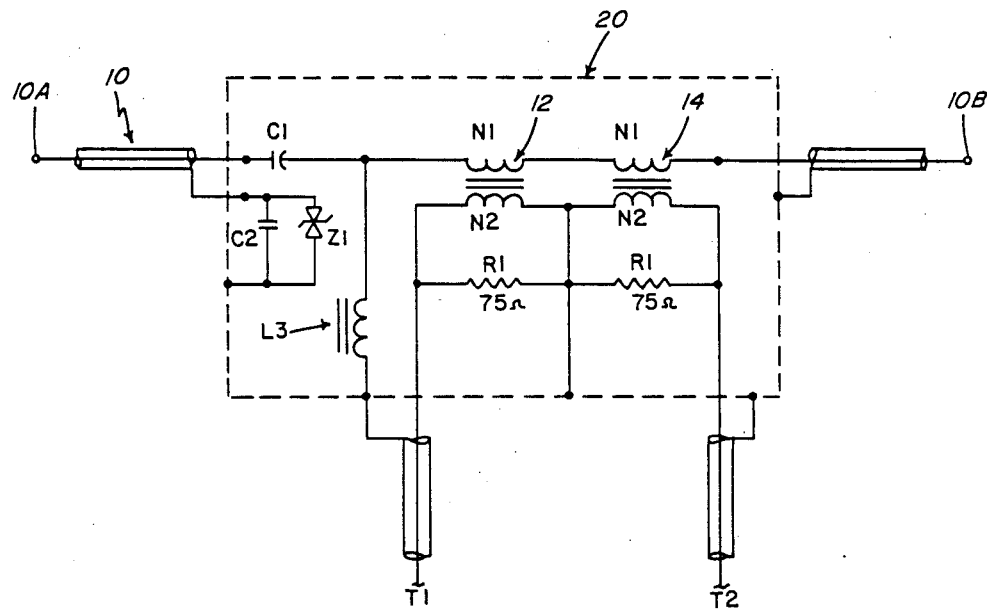
FIG. 4 is an alternate embodiment for the two port version.
Figure 5:
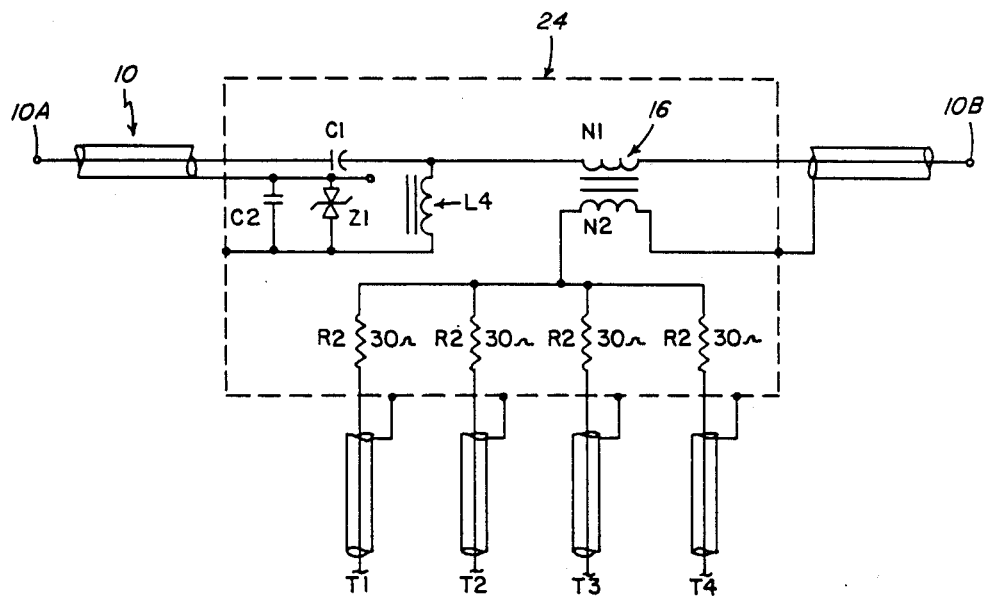
FIG. 5 is an alternate embodiment for the four port version.
Figure 6:
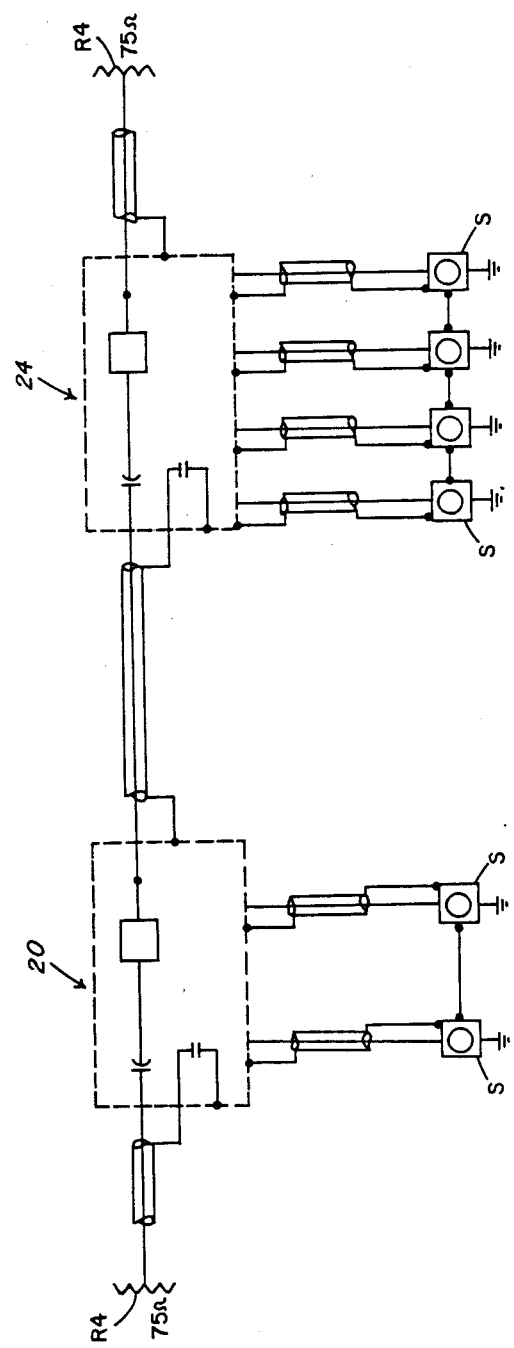
FIG. 6 is a schematic diagram illustrating a system application.

Reference is now made to FIGS. 4-6 for an illustration of further alternate embodiments of the invention. FIG. 4 shows a two port coupler and FIG. 5 shows a four port coupler. It is noted that the construction of the circuits illustrated in FIGS. 4-6 are quite similar to the circuit arrangements illustrated in FIGS. 1-3. However, the couplers illustrated in FIGS. 4 and 5 have additional isolation components associated therewith.

In FIG. 4, there is provided a capacitor C1 in the cable 10, coupling to the transformer primary windings N1. There is furthermore provided a capacitor C2 and associated Zener diode Z1, connected in parallel. This provides ground isolation for a single point grounding application. The capacitors C1 and C2 are isolation capacitors. FIG. 5 also illustrates the capacitors C1 and C2 and the Zener diode Z1 as well as the aforementioned resistors R2. Also note matching inductors L3 and L4 in FIGS. 4 and 5, respectively.

FIG. 6 illustrates a single point grounding application for the couplers of FIGS. 4 and 5. FIG. 6 illustrates the termination resistors R4 as well as the connection of the taps of the coupler to the subscriber devices S.

In connection with the two tap embodiment of the present invention there is now set forth herein a derivation that indicates certain parameters significant in connection, in particular, with the isolation provided by the circuit designs described herein. In this connection refer to the equivalent circuit diagrams of FIGS. 7 and 8. In this connection let $Zs = Z1 = Z1 = Z2 = 75$ ohm and let $E1 = 1$ volt. The following derivations apply:

(1) Secondary Load Impedance $$Z4 = \frac{R1 * Z1}{R1 + Z1} = 37.5\Omega \quad \text{(FIG. 8)}$$

$$Z5 = \frac{R2 * Z2}{R2 + Z2} = 37.5\Omega \quad \text{(FIG. 8)}$$

(2) Primary Winding Impedance $$RP1 = \frac{Z4}{(N2/N1)^2} = 1.5\Omega \quad \text{(FIG. 8)}$$

$$RP2 = \frac{Z5}{(N2/N1)^2} = 1.5\Omega \quad \text{(FIG. 8)}$$

(3) Trunk Input Impedance $$Z1 = RP1 + RP2 + ZL = 78\Omega$$

(4) Trunk Input Voltage Reflection Coefficient $$r1 = \left| \frac{(Z1/Z0) - 1}{(Z1/Z0) + 1} \right| = .0196 \quad \text{(FIG. 8)}$$

In this derivation note that the inclusion of inductor L1 will introduce a shunt impedance that lowers Z1, hence close to 75 ohms, hence improved trunk return loss.

(5) Trunk Return Loss $$20 \, \text{Log}_{10}(r1) = -34.2 \, \text{dB}$$

(6) Trunk Output Voltage $$E2 = E1 - \left[ (RP1 + RP2) \frac{E1}{[Z0 + RP1 + RP2]} \right] \quad \text{(FIG. 8)}$$

$$E2 = 962 \, \text{mv}$$

(7) Insertion Loss (Trunk)

$$IL1 = 20 \, \text{Log}_{10} \left( \frac{E2}{E1} \right) = .336 \, \text{dB}$$

(8) E3 = Secondary Output Voltage
Let N = Secondary Turns/Primary Turns ratio
Using the voltage as the determination factor, and since there are two segments of the circuitry, the turns ratio is determined by the amount of voltage that is inductively coupled from the primary winding to the secondary winding. Since the tap of each port is terminated individually by a single 75 ohm resistor, the voltage is therefore equally divided between the tap and the 75 ohm termination resistor, hence, a loss of $-6$ dB. Therefore, the transformer is really a $-14$ dB transformer:

$$-20 \text{ dB} = (-6 \text{ dB}) + 20 * \log(n1/n2);$$

$$-14/20 = \log(n1/n2)$$

$$n1/n2 = 10^{**}(-0.7) = 0.199 = 0.2$$

A turn of ratio of (n1:n2) of 1:5 is determined.

$$E3 = (1/N2) = 100 \text{ mv}$$

(9) IL2=Trunk to Tap Insertion Loss $$IL2 = 20 \text{ Log}_{10}\left[\frac{E3}{E1}\right] = 20 \text{ Log}_{10}\left[\frac{.100}{1}\right] = -20 \text{ dB} \quad \text{(FIG. 8)}$$

Figure 7:
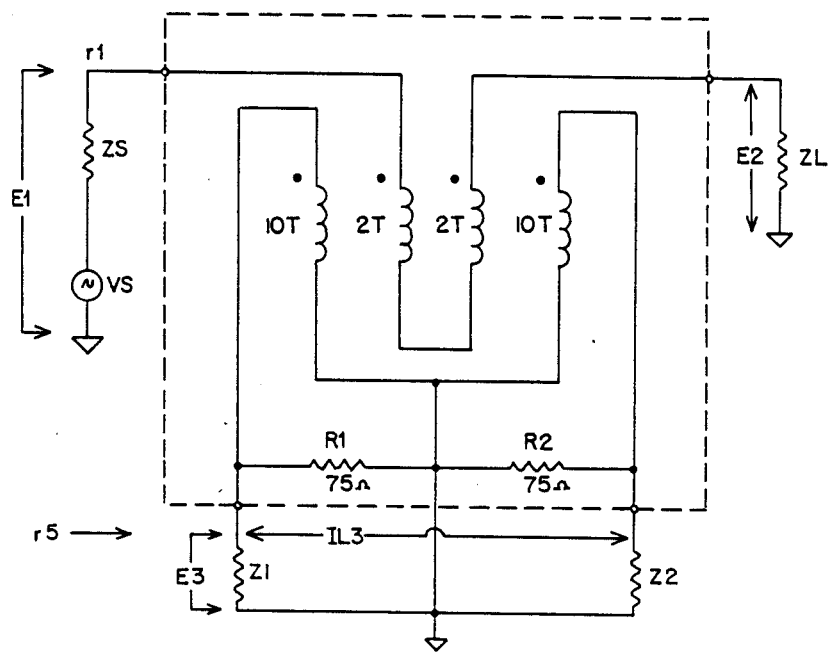
FIGS. 7 and 8 are equivalent circuit diagrams useful in derivations set forth herein.
Figure 8:
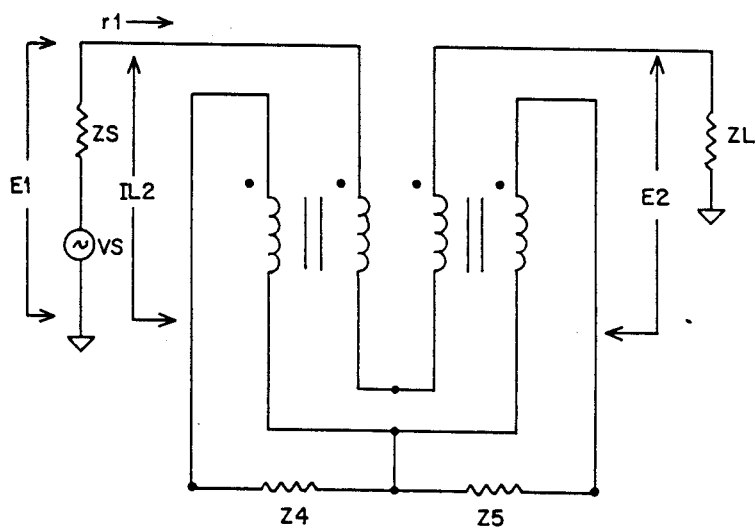

(10) R1=R2 =R shunt matching resistors (per FIG. 7)

$$\begin{aligned} R1 = R2 &= 75/(1 - 1/N^2 * 2) \\ &= 75/(1 - 1/25 * 2) \\ &= 75/(1 - .020) = 76.53\Omega \end{aligned}$$

From a practical standpoint R1 and R2 are selected as 75 ohm resistors as that is within a small percentage of the derived value.

(11) ZR5=Tap Port Input Impedance $$ZR5 = \frac{1}{\left[\frac{1}{(N2/N1)^2 * (Z5 + ZL)}\right] + \left[\frac{1}{R1}\right]}$$

$$ZR5 = 73.53\Omega$$

(12) r5=Tap Port Input Reflection Coefficient $$r5 = \left|\frac{(Z1/ZR5) - 1}{(Z1/ZR5) + 1}\right| = .0099$$

(13) VSWR-Tap=Tap Port Return Loss
VSWR-Tap=20 Log$_{10}$[r5]= $-40.09$ dB
(14) IL3=Isolation from Tap Port to Tap Port (FIG. 7)
IL3=(2 * IL2)= $-40$ dB In connection with the four tap embodiment of the present invention there is now set forth herein a derivation that indicates certain parameters significant in connection, in particular, with the isolation provided by the circuit designs described herein. In this connection refer to the equivalent circuit diagrams of FIGS. 9, 10, 11, and 12 and let $Z_S = Z_L = Z_0 = 75$ ohms as generally described in the transmission line model of FIG. 9(e). The following derivations apply:

Similar to the two port derivation set forth above, the transformer coupled energy is divided among four ports. Therefore, there is a $-12$ dB loss of voltage from the transformer to each tap output. Hence, a $-8$ dB transformer is needed:

$$-20 \text{ dB} = (-12 \text{ dB}) + 20 \log(n1/n2)$$

$$-8 \text{ dB}/20 = \log(n1/n2)$$

$$n1/n2 = 10^{**}(-0.4) = 0.398 = 0.4$$

Figure 9A:
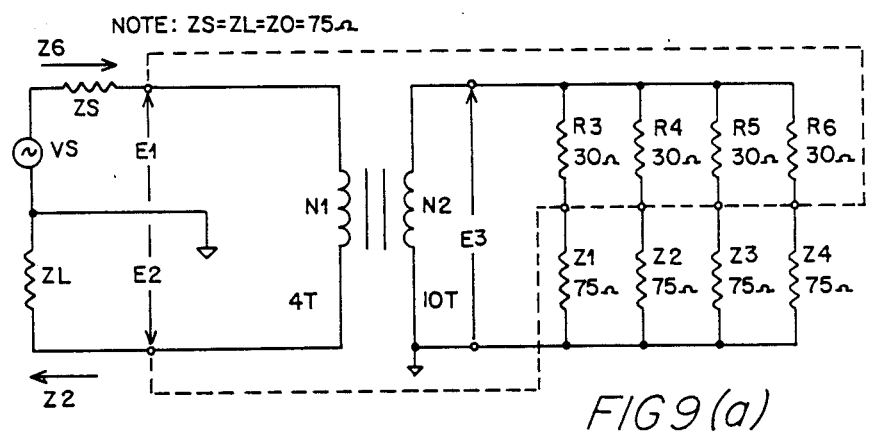
Figure 9B:
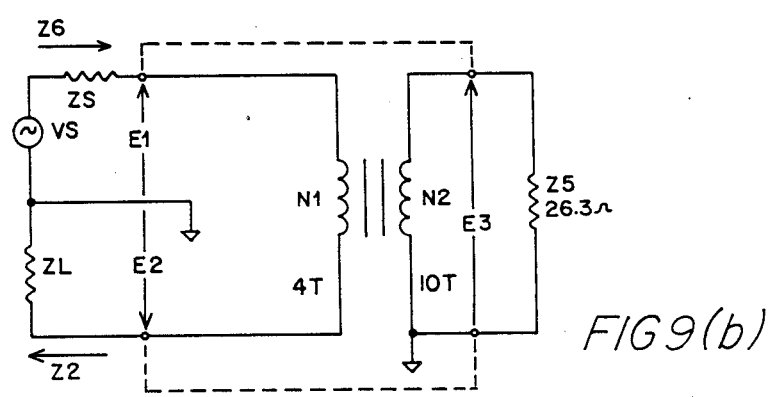

A turn ratio of (n1:n2) of 1:2.5 is determined.
(1) Secondary Load Impedance Let R3=R4=R5=R6=30 (FIG. 9(a)) Z1=Z2=Z3=Z4=75 (FIG. 9(a)) then $$Z5 = \frac{1}{\frac{1}{R3 + Z1} + \frac{1}{R4 + Z2} + \frac{1}{R5 + Z3} + \frac{1}{R6 + Z4}}$$

$$Z5 = \frac{(R3 + Z1)}{4}$$

$$Z5 = \frac{(30 + 75)}{4} = 26.3\Omega \quad \text{(FIG. 9(b))}$$

Figures 9C, 9D:
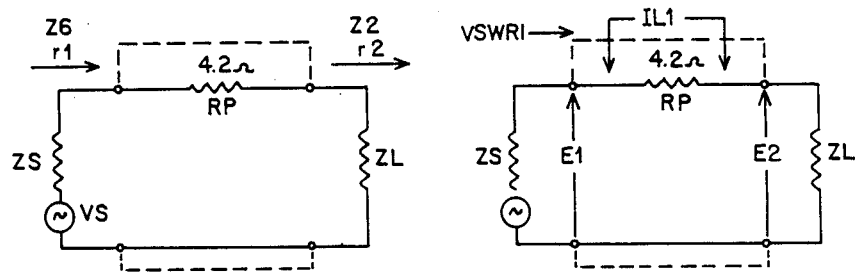
Figure 9E:
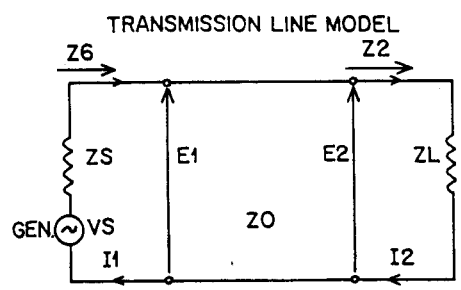

(2) RP=Equivalent Series Primary Winding Impedance $$RP = \frac{Z5}{(N2/N1)^2} = 4.2\Omega = \frac{26.3}{(10/4)^2} = \quad \text{(FIG. 9(c))}$$

$$\frac{26.3}{(2.5)^2} = \frac{26.3}{6.25}$$

(3) Z6=Trunk Input Impedance $$Z6 = \frac{1}{\frac{1}{\frac{ZL*R2}{ZL + R2} + RP} + \frac{1}{R1}} = 78\Omega \quad \text{(FIG. 9(b))}$$

(4) r=Voltage Reflection Coefficient $$r1 = \left|\frac{(Z6/ZS) - 1}{(Z6/ZS) + 1}\right| = .0196 \quad \text{(FIG. 9(c))}$$

(5) VSWRI=Input Return Loss in Decibels $$\text{VSWRI} = 20 \text{ Log}_{10}[r1] = -34.2 \text{ dB (FIG. 9(d))}$$

(6) E2=Trunk Output Voltage (E1=1V) Since R1>ZL, and R2 >ZL $$E2 \approx E1 - \left[RP\left[\frac{E1}{Z0 + RP}\right]\right] = .947 \text{ volts} \quad \text{(FIG. 9(d))}$$

(7) IL1=Trunk Insertion Loss (E1=1V)

$$IL1 \approx 20 \text{ Log}_{10}\left[\frac{E2}{E1}\right] = -.473 \text{ dB} \quad \text{(FIG. 9(d))}$$

(8) E3=Secondary Output Voltage
Let E1=1 volt and ZS=75$\Omega$ $$E3 = \frac{E1}{(N2/N1)^2} = \frac{1}{(10/4)^2} = .160 \text{ volts} \quad \text{(FIG. 10(a))}$$

(9) IL2=Coupler Loss in Decibels $$IL2 = 20 \text{ Log}_{10}\left[\frac{E3}{E1}\right] \quad \text{(FIG. 10(b))}$$

-continued $$IL2 = 20 \, \text{Log}_{10}\left[\frac{.160}{1}\right] = -15.9 \text{ dB}$$

(10) E4=Tap Output Voltage $$E4 = E3\left[\frac{Z1}{R3 + Z1}\right] = .160\left[\frac{75}{30 + 75}\right] = .114 \text{ volts}$$

IL3=Resistive Divider Loss in Decibels $$IL3 = 20 \, \text{Log}_{10}\left[\frac{E4}{E3}\right] = 20 \, \text{Log}_{10}\left[\frac{.114}{.160}\right] = -2.94 \text{ dB} \quad \text{(FIG. 10(c))}$$

(11) Trunk to Tap Loss=IL2+IL3=−18.8 dB (FIG. 10(d))

Figure 11A:
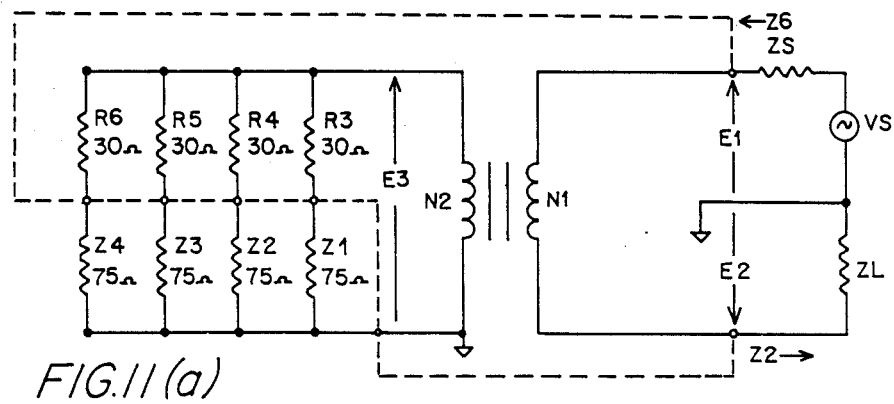
Figure 11B:
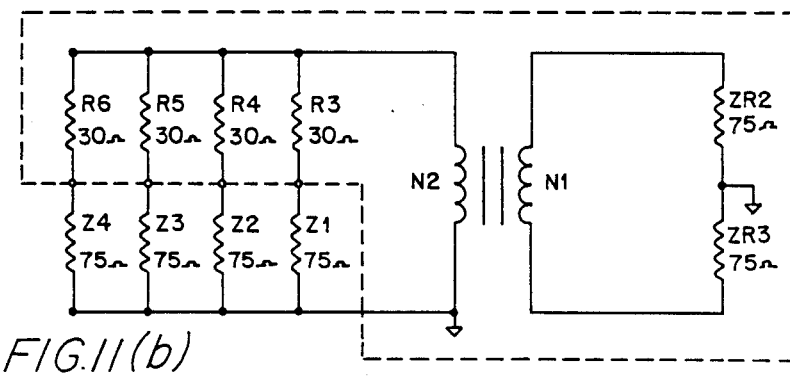

(12) Effective Trunk Load and Source Impedance $$ZR2 = \frac{1}{\frac{1}{R1} + \frac{1}{ZS}} = 74.4\Omega. \quad \text{(FIGS. 11(a) and (b))}$$

$$ZR3 = \frac{1}{\frac{1}{R2} + \frac{1}{ZL}} = 74.4\Omega. \quad \text{(FIGS. 11(a) and (b))}$$

note that ZR2 and ZR3 are frequency dependent due to the introduction of L2 shunt impedance for better system matching.

Figure 11C:
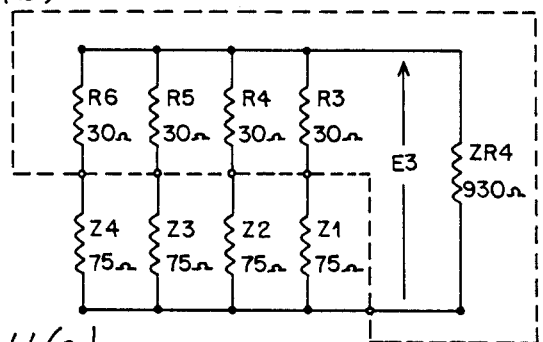

(13) Effective Coupling Impedance $$ZR4 = (N2/N1)^2 * (ZR3+ZR2) = 930\Omega \quad \text{(FIG. 11(c))}$$

Figure 11D:
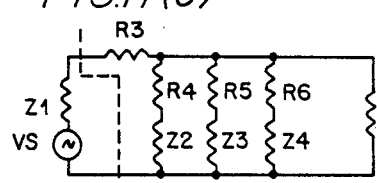
Figure 11E:
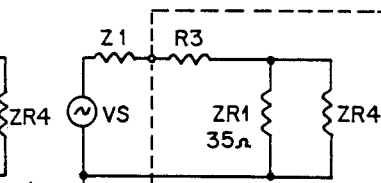

(14) ZR1=Effective Resistive Loading $$ZR1 = \frac{1}{\frac{1}{R4 + Z2} + \frac{1}{R5 + Z3} + \frac{1}{R6 + Z4}} = 35\Omega \quad \text{(FIGS. 11(d) and (e))}$$

Figure 11F:
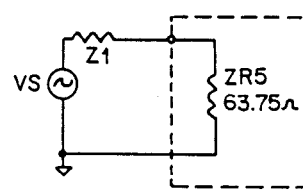

(15) ZR5=Tap Port Input Impedance $$ZR5 = \frac{1}{\frac{1}{ZR4} + \frac{1}{ZR1}} + R3 = 63.75\Omega \quad \text{(FIG. 11(f))}$$

(16) r5=Tap Port Input Reflection Coefficient $$r5 = \left|\frac{(Z1/ZR5) - 1}{(Z1/ZR5) + 1}\right| = .081$$

(17) VSWR-Tap=Tap Port Return Loss

VSWR-Tap=20 Log$_{10}$ [r5]=−21.8 dB

Figure 12A:
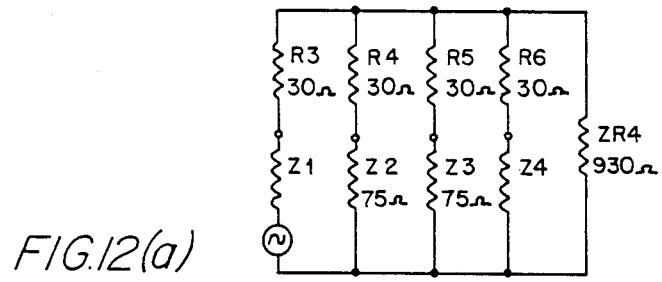
Figure 12B:
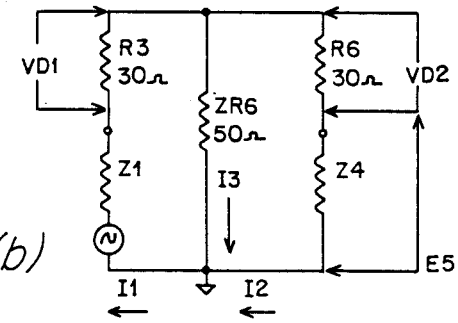

(18) ZR6=Intermediate Impedance Value $$ZR6 = \frac{1}{\frac{1}{ZR4} + \frac{1}{Z3 + R5} + \frac{1}{Z2 + R4}} \quad \text{(FIGS. 12(a) and (b))}$$

$$= \frac{1}{\frac{1}{930\Omega} + \frac{1}{75 + 30} + \frac{1}{75 + 30}} = 49.69\Omega$$

Figure 12C:
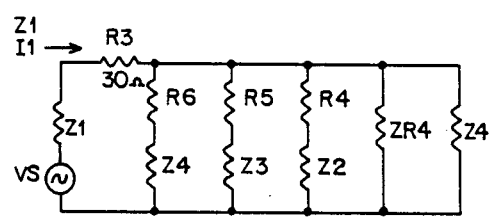

(19) Branch Currents I1, I2, I3 Let E6=1V, ZR5=63.75Ω

$$I1 = \frac{E6}{ZR5} = 15.7 \text{ MA} \quad \text{(FIG. 12(c))}$$

$$I3 = \frac{E6 - (R3*I1)}{ZR6} = 10.6 \text{ MA}$$

Figure 12D:
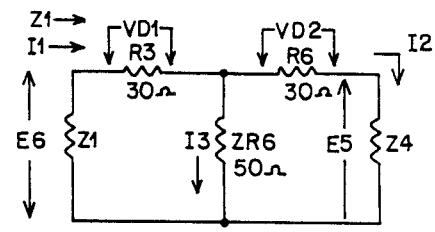

I2=I1−I3=5.1MA
VD1=I1 *R3=0.471 MV (FIG. 12(d))
VD2=I2 *R6=0.153 MV

20) E5=Tap Port Output Voltage
E5=1−(VD+VD2)=3.76 MV

(21) IL3=Isolation from Tap Port to Tap Port $$IL3 = 20 \, \text{Log}_{10}\left[\frac{E5}{E6}\right] = -8.5 \text{ dB} \quad \text{(FIG. 12(d))}$$

Having now described a limited number of embodiments of the present invention, it should be apparent to those skilled in the art that numerous other embodiments and modifications thereof are contemplated as falling within the scope of the present invention as defined by the appended claims.

What is claimed is:

1. In combination, a communication line having input and output sides and a low frequency multi-port signal coupler for intercoupling with the communication line and separate utilization devices, said multi-port signal coupler having a first pair of terminals for intercoupling in said communication line and at least a second pair of output taps, said output taps coupled to at least one utilization device, said multi-port signal coupler including a pair of transformers each having primary and secondary windings and with the pair of primary windings coupled in series between said first pair of terminals, and termination resistor means coupling from said secondary winding to said output taps.

2. The combination as set forth in claim 1 wherein the termination resistor means comprises a plurality of separate termination resistors coupled in common to one side of said secondary windings.

3. The combination as set forth in claim 2 wherein each of the termination resistors couples to an output tap.

4. The combination as set forth in claim 3 wherein the other side of the secondary winding couples to a circuit common.

5. The combination as set forth in claim 4 including an additional resistor connected to at least one of the terminals of the first pair of terminals and having one side coupled to the circuit common.

6. The combination as set forth in claim 1 wherein the termination resistor means comprises a pair of termination resistors and means coupling the pair of termination resistors in parallel with the secondary windings of said pair of transformers.

7. The combination as set forth in claim 6 wherein one side of said secondary windings and one side of said termination resistors are tied to a circuit common.

8. The combination as set forth in claim 1 including a first capacitor connected in series with the primary windings of said pair of transformers.

9. The combination as set forth in claim 8 including a second capacitor and Zener diode coupled in parallel and connected between a shield ground associated with the communication line and a coupler common.

10. A low frequency multi-port signal coupler for intercoupling with a communication line and separate utilization devices, said low frequency multi-port signal coupler including a first pair of terminals for intercoupling in said communication line and at least a second pair of taps, a pair of coupling transformers, each having primary and secondary windings, means coupling the primary windings in series between said pair of terminals, at least one pair of termination resistors, means for coupling one side of each of the termination resistors to a respective output tap and the other side of each of the termination resistors to the secondary windings, said output tap associated with each termination resistor coupled to a terminal of a utilization device.

11. A multi-port signal coupler as set forth in claim 10 including means coupling one side of the secondary windings and termination resistors to a circuit common.

12. A multi-port signal coupler as set forth in claim 11 including a first capacitor connected in series with said primary winding means of said coupling transformer.

13. A multi-port signal coupler as set forth in claim 12 including a second capacitor and Zener diode coupled in parallel and connected between a shield ground associated with the communication line and a coupler common.

14. A multi-port signal coupler as set forth in claim 10 wherein the turns ratio for each coupling transformer is on the order of 1:5.

15. A multi-port signal coupler as set forth in claim 10 including an inductor coupled at one of the terminals of the communication line.

16. A low frequency multi-port signal coupler for intercoupling with a communication line and separate utilization devices, said low frequency multi-port signal coupler including a first pair of terminals for intercoupling in said communication line and at least a second pair of output taps, a coupling transformer having primary and secondary windings, a plurality of termination resistors, means coupling the primary winding between said first pair of terminals, means for coupling one side of the secondary winding in common to one side of each of the termination resistors, and means coupling the other side of the termination resistors to respective output taps, said output taps associated with each termination resistor coupled to a terminal of a utilization device.

17. A multi-port signal coupler as set forth in claim 16 including an additional resistor coupling from at least one of the terminals of the first pair of terminals to the signal common.

18. A multi-port signal coupler as set forth in claim 17 wherein the other side of the secondary winding is coupled to a circuit common.

19. A multi-port signal coupler as set forth in claim 16 including a first capacitor connected in series with said primary winding of said coupling transformer.

20. A multi-port signal coupler as set forth in claim 19 including a second capacitor and Zener diode coupled in parallel and connected between a shield ground associated with the communication line and a coupler common.

21. A multi-port signal coupler as set forth in claim 16 wherein the turns ratio for said coupling transformer is on the order of 1:2.5.

22. A multi-port signal coupler as set forth in claim 16 including an inductor coupled at one of the terminals of the communication line.

* * * * *